United States Patent [19]
Danstrom

[11] Patent Number: 5,638,031
[45] Date of Patent: Jun. 10, 1997

[54] PRECISION OSCILLATOR CIRCUIT

[75] Inventor: Eric J. Danstrom, Farmington Hills, Mich.

[73] Assignee: SGS-Thomson Microelectronics, Inc., Carrollton, Tex.

[21] Appl. No.: 592,922

[22] Filed: Jan. 29, 1996

[51] Int. Cl.$^6$ ..................................................... H03B 5/20
[52] U.S. Cl. ............................................................ 331/111
[58] Field of Search ........................................ 331/111, 147, 331/112, 143; 327/535, 536, 538, 53, 132, 172, 175, 176

[56] References Cited

U.S. PATENT DOCUMENTS 4,365,212  12/1982  Gentile et al. ..................... 331/111

Primary Examiner—Robert Pascal
Assistant Examiner—An T. Luu
Attorney, Agent, or Firm—Theodore E. Galanthay; Lisa K. Jorgenson

[57] ABSTRACT

A precision oscillator constructed from a reference current generator, a charge control stage, a capacitor, a comparator, and a voltage threshold generator is disclosed. The reference current generator generates a reference current which is used by the charge control stage to either charge or discharge the capacitor. The comparator compares the voltage on the capacitor to one of two voltages from the voltage threshold generator. The frequency of oscillation is controlled by an external resistor and an external capacitor. Alternatively, the frequency of oscillation can be controlled by adding or subtracting parallel transistors in a current mirror in the reference current generator.

23 Claims, 2 Drawing Sheets

PRECISION OSCILLATOR CIRCUIT

BACKGROUND OF THE INVENTION

1. Field of the Invention

This invention relates to electronic oscillator circuits used to generate digital clock signals and more specifically to precision oscillator circuits.

2. Description of the Relevant Art

The problem addressed by this invention is encountered in oscillator circuits used for generating precision clock signals. Precision clock signals are widely used in digital circuits to synchronize the activities of one digital circuit to the rest of the circuits in the system. A digital system may include one or more microprocessors, buss controllers, peripheral controllers, memory, and peripherals such as disk drives, all of which would be synchronized from one system clock. A less complex system may include a single microcontroller with at least one input device, such as a sensor, and at least one output device, such as an ignition controller. And yet a less complex system may include an oscillator to provide a frequency reference for the speedometer or tachometer of an automobile. It will be appreciated that precision oscillators are used in simple systems, complex systems, and everything in between.

Reference now to FIG. 1, a precision oscillator 24 according to the prior art is shown. The oscillation cycle begins by setting and resetting RS flip-flop 20. The flip-flop 20 is set by current source 2 charging capacitor 4. As capacitor 4 is charged, the voltage on the non-inverting input of comparator 8 rises. When this voltage exceeds the voltage, Vcalib, on the inverting input, the output of comparator 8 will rise to the positive voltage rail of the comparator thereby setting the output of flip-flop 20 to a digital "1" voltage. This subsequently turns off current source 2, turns on transistor 6, turns off transistor 14 (which was on), and turns on current source 10. Consequently, capacitor 12 is charged by current source 10 and the voltage on the non-inverted input of comparator 16 rises. When the voltage on the non-inverting input of comparator 16 exceeds the voltage on the inverting input, the output of comparator 16 will swing to a the positive voltage rail thereby resetting the output of flip-flop 20 to a digital "0". The resetting of flip-flop 20 subsequently turns current source 2 on, transistor 6 off, transistor 14 on, and current source 10 off, thereby restarting the oscillation cycle.

From FIG. 1, it is shown that this circuit requires two capacitors 4 and 12, two comparators 8 and 16, and an RS flip-flop.

Therefore, it is an object of the invention to provide a precision oscillator which requires fewer capacitors.

It is yet another object of the invention to require one comparator instead of two comparators.

It is and yet another object of the invention to provide a precision oscillator which oscillates at a frequency independent of the of the supply voltage.

These and other objects, features, and advantages of the invention will be apparent to those skilled in the art from the following detailed description of the invention, when read with the drawings and appended claims.

SUMMARY OF THE INVENTION

The invention can be summarized as a precision oscillator constructed from a reference current generator, a charge control stage, a capacitor, a comparator, and a voltage threshold generator. The reference current generator generates a reference current which is used by the charge control stage to either charge or discharge the capacitor. The comparator compares the voltage on the capacitor to one of two voltages from the voltage threshold generator. The frequency of oscillation is controlled by an external resistor and an external capacitor. Alternatively, the frequency of oscillation can be controlled by adding or subtracting parallel transistors in a current mirror in the reference current generator.

DETAILED DESCRIPTION OF THE PREFERRED EMBODIMENT

A precision oscillator constructed according to a the preferred embodiment of the invention will be described.

Figure 1:
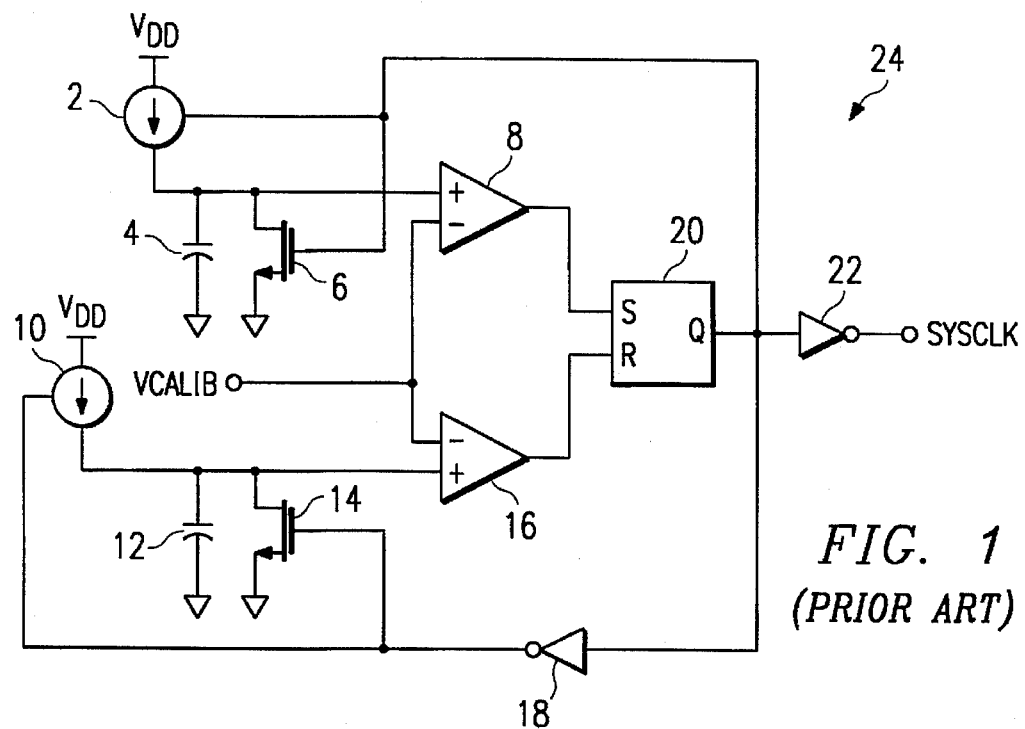
FIG. 1 is a schematic drawing of a precision oscillator as known in the prior art.
Figure 2:
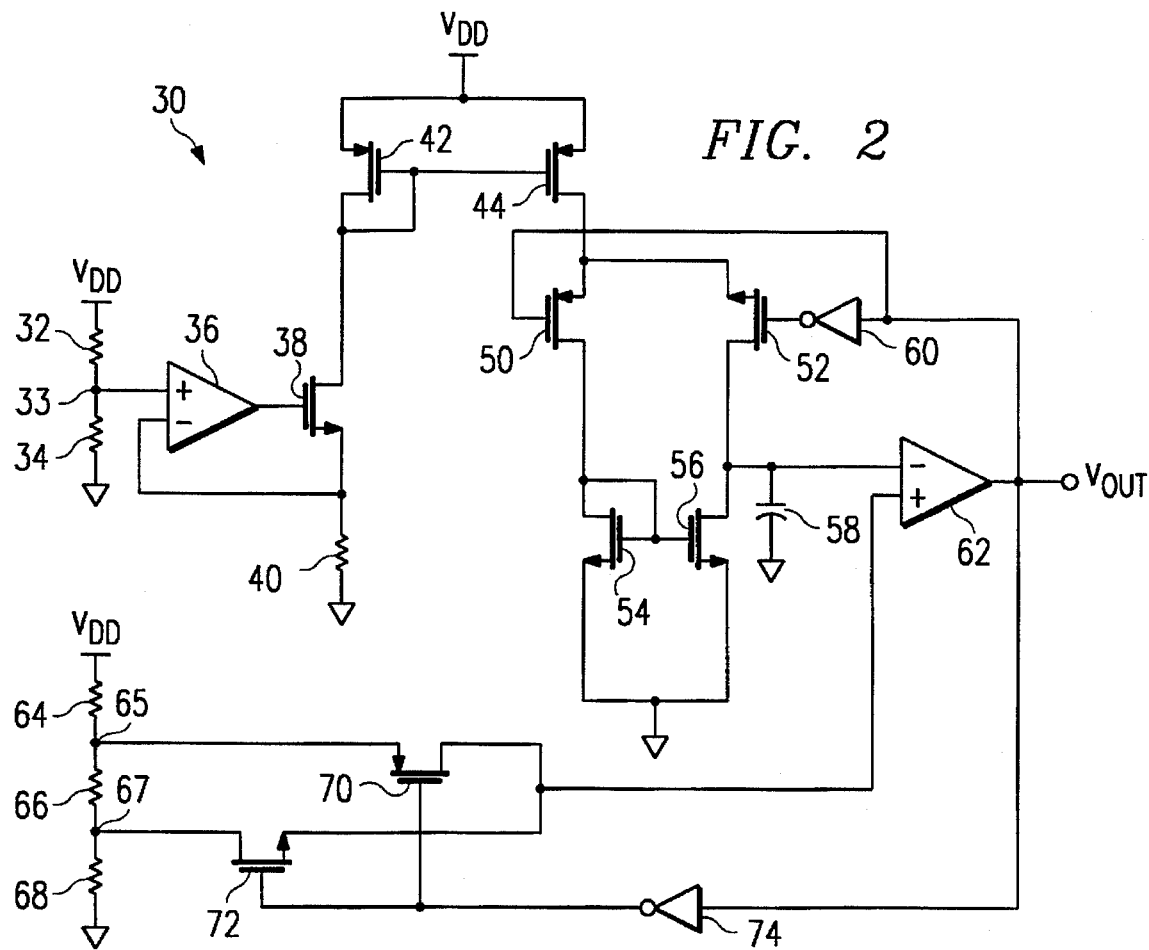
FIG. 2 is a schematic drawing of a precision oscillator as disclosed in an embodiment of the invention.

Precision oscillator 30 in FIG. 2 is constructed with a reference current generator, a charge control stage, a capacitor, a comparator, and a voltage threshold generator.

The reference current generator is constructed using resistors 32, 34, and 40, amplifier 36, N-channel transistor 38, and P-channel transistors 42 and 44. More specifically, the first end of resistor 32 is connected to a voltage source Vdd and the second end of resistor 32 is connected to the noninverting input of amplifier 36 and the first end of resistor 34. The second end of resistor 34 is connected to ground. The output of amplifier 36 is connected to the gate of transistor 38. The source of transistor 38 is connected to the inverting input of amplifier 36 and to the first end of resistor 40, the second end of resistor 40 is connected to ground. This configuration is commonly referred to as a voltage follower since transistor 38 will be driven by amplifier 36 so that the voltage on resistor 40 follows the voltage on noninverting input of comparator 36. The drain of transistor 38 is connected to a current mirror made from transistors 42 and 44. The drain of transistor 38 is connected to the drain and gate of transistor 42 and the gate of transistor 44. The sources of transistors 42 and 44 are connected to Vdd. The drain of transistor 44 is the mirrored current output of the current mirror and is also the output of the reference current generator.

The charge control stage is constructed using P-channel transistors 50 and 52, N-channel transistors 54 and 56, and inverter 60. The sources of transistors 50 and 52 are coupled together to form the input of the charge control stage and are therefore, coupled to the output of the reference current generator. The gate of transistor 50 is connected to the input of inverter 60. The output of inverter 60 is connected to the gate of transistor 52. The drain of transistor 50 is connected to the drain and gate of transistor 54 and to the gate of transistor 56. The sources of transistors 54 and 56 are connected to ground. The drains of transistors 52 and 56 are connected together to form the output of the charge control stage. This output is connected to a first end of capacitor 58 and the inverting input of comparator 62.

The noninverting input of comparator 62 is connected to the output of the voltage threshold generator. The output of the comparator is the output of the oscillator and is connected to the input of inverter 60, the gate of transistor 50, and the gates of transistors 70 and 72.

The voltage threshold generator is constructed by connecting three resistors 64, 66 and 68 in series across the supply voltage. These three resistors can be of equal value such that node 65 between resistor 64 and 66 has a voltage of approximately ⅔ the supply voltage. Similarly, the voltage at node 67 between resistors 66 and 68 has a voltage of approximately ⅓ the supply voltage. Alternate methods for generating two reference voltages will be known by persons skilled in the art. The source of transistor 70 is connected to node 65. The source of transistor 72 is connected to node 67. The gates of transistors 70 and 72 are connected to the output of inverter 74. The input of inverter is connected to the output of comparator 62. The drain of transistor 70 and the source of transistor 72 are connected together and to the noninverting input of comparator 62.

In operation, the reference current generator generates a reference current which is equal a function of the voltage at node 33, the resistance of resistor 40, and the ratio of transistors 42 and 44. Since amplifier 36 is configured as a voltage follow, the voltage on the noninverting input of amplifier 36 will be maintained across resistor 40. Thus, the current through resistor 40 is:

$$I_{40} = \frac{V_{33}}{R40}$$

$V_{33}$ is established by selecting resistors 32 and 34 to generate the desired voltage reference as is well known in the art. $I_{40}$ is then mirrored by the current mirror constructed with transistors 42 and 44. Therefore, the reference current is the current at the drain of transistor 44 and can be adjusted by adjusting variables in the above equation as well as the ratio of area between transistors 42 and 44, as will be discussed later in this specification.

The charge control stage is used to direct the reference current generated from the reference current generator either to capacitor 58 or to remove the reference current from the capacitor. More specifically, when the output of comparator 62 is high, transistor 50 is turned off and transistor 52 is turned on. Therefore, the reference current from the reference current generator is conducted through transistor 52 onto capacitor 58. Conversely, when the output of comparator 62 is low, transistor 50 is on and transistor 52 is turned off. Therefore, the reference current from the reference current generator is conducted through transistor 50 and therefore, through the current mirror made from transistors 54 and 56. If the ratio between transistors 54 and 56 is approximately equal to one, a current approximately equal to the reference current will be discharged from capacitor 58. In short, the charge control stage either charges capacitor 58 or discharges capacitor 58 responsive to the output of comparator 62.

The voltage threshold generator couples either the voltage at node 65 or the voltage at node 67 to the noninverting input of comparator 62. When the output of comparator 62 is high, the output of the inverter 74 is low so that transistor 70 is on and transistor 72 is turned off so that the voltage at node 65 is coupled to the noninverting input of comparator 62. Conversely, the voltage at node 67 is coupled to the noninverting input of comparator 62 when the output of comparator 62 is at a low voltage level which drives the output of inverter 74 high.

Figure 4:
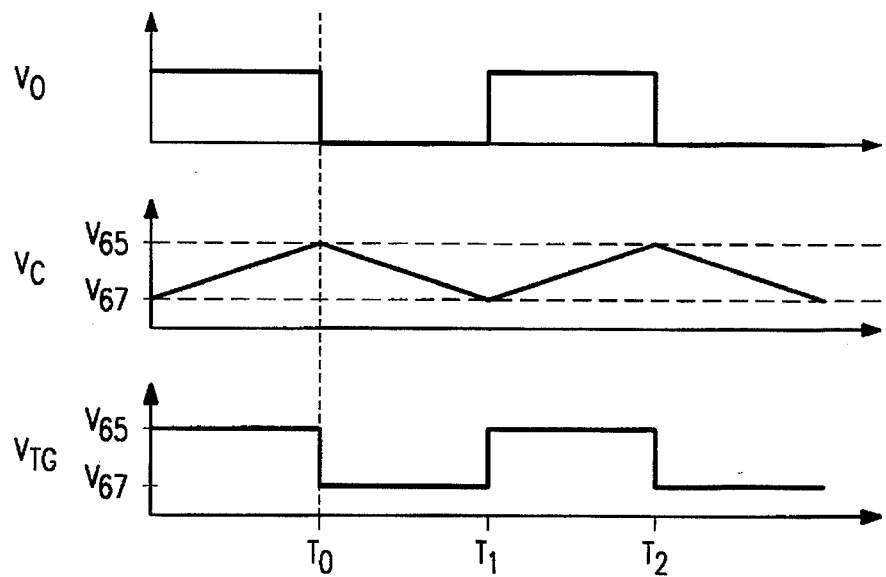
FIG. 4 is a timing diagram of the disclosed invention.

As shown in FIG. 4, an oscillation cycle at begins $T_0$ when the output of comparator 62, Vo is at a low voltage level. In this state, the charge control stage is discharging capacitor 58 at a rate proportional to the reference current and inversely proportional to the size of the capacitor. The voltage on the capacitor, Vc, is discharging at a constant rate. The noninverting input of comparator 62 is coupled to the voltage, $V_{67}$ at node 67. When the voltage on capacitor 58 falls below the voltage on the noninverting input of comparator 62 the comparator 62 switches to a high voltage state, as shown at $T_1$. Consequently, the charge control stage begins to charge capacitor 58 and the voltage threshold generator changes the voltage threshold to the voltage at node 65. When the voltage on capacitor 58 exceeds the voltage on node 65 comparator 62 will again change states such that the output is now again at a low voltage and the oscillation cycle will restart, as shown at $T_2$. The frequency of oscillation is controlled by controlling reference current and the capacitance of C58.

Figure 3:
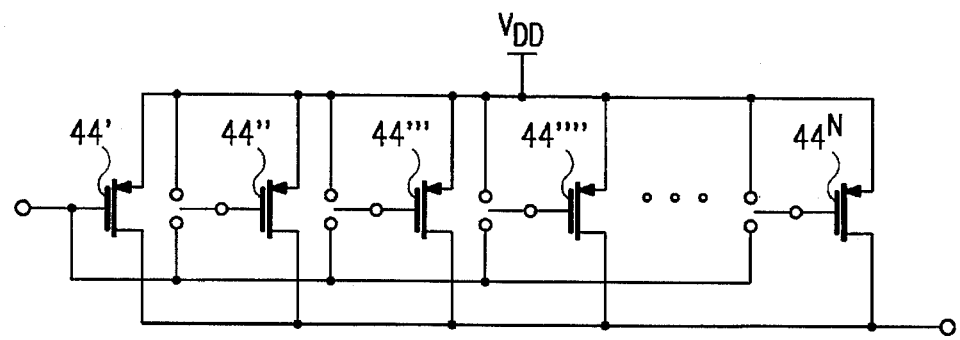
FIG. 3 is a schematic drawing of a current source as described in an alternate embodiment of the invention.

By using the disclosed precision oscillator only one capacitor 58 is required, as compared to two capacitors in the prior art. Additionally, only one comparator 62 is required, compared to the two comparators required in the prior art. FIG. 2 shows transistor 44 as the mirrored current stage of a current mirror in the reference current generator. FIG. 3 shows that transistor 44 of FIG. 2 can be a series of transistors coupled in parallel. More specifically, FIG. 3 shows the source of transistors 44', 44", 44"', 44"", and $44^n$ all connect to the source voltage Vdd. Similarly, the drains of transistors 44', 44", 44"', 44"", and $44^n$ are all connected together and form the output of the current mirror. The gate of transistor 44' would be connected to the gate and drain of transistor 42 of FIG. 2. Additionally, the gate of transistors 44' through $44^n$ can either be connect to Vdd or to the gate of transistor 44'. Thus, it would be possible to trim the current of the reference current generator in either the manufacturing process or the design process of the precision oscillator. Consequently, this circuit also provides the benefit of providing a precision oscillator which oscillates as a function of current (the reference current) instead of as a function of the supply voltage.

Figure 5:
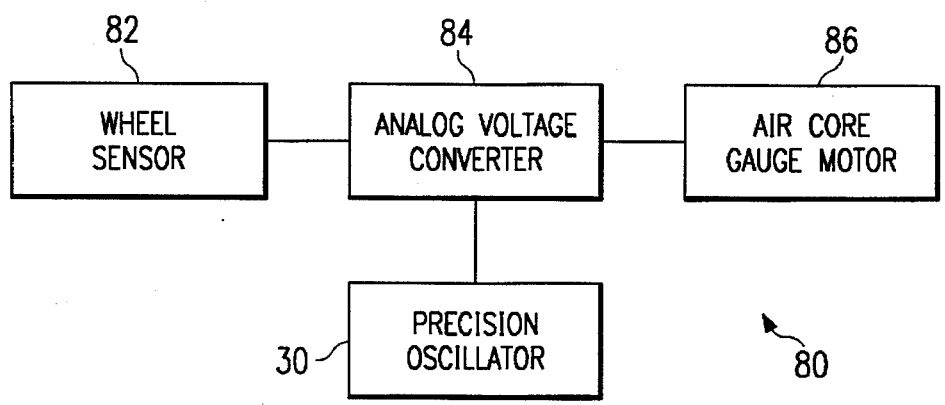
FIG. 5 is block diagram of speedometer system which includes the disclosed invention.

FIG. 5 illustrates a speedometer system 80 which uses the precision oscillator 30. More specifically, this figure shows a wheel sensor 82 coupled to an analog voltage converter 84. The analog voltage converter 84 and precision oscillator are combined to drive the air core gauge motor 86, which drives the speedometer display as is known in the art.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A precision oscillator circuit comprising:

a reference current generator having an output for supplying a reference current;

a charge control stage having a first input coupled to the output of the reference current generator, having a second input, and having an output;

a capacitor having a first plate coupled to the output of the charge control stage and having a second plate coupled to ground;

a comparator having a first input coupled to the first plate of the capacitor, having a second input, and having an output coupled to the second input of the charge control stage; and a voltage threshold generator having an input coupled to the output of the comparator and having an output coupled to the second input of the comparator.

2. The precision oscillator of claim 1 wherein the charge control stage comprises:

an inverter having an input coupled to the output of the comparator and having an output;

a first transistor having a control element coupled to the input of the inverter, and having a current path with a first end and a second end;

a second transistor having a control element coupled to the output of the inverter and having a current path with a first end coupled to the first end of the first transistor and having a second end; and a current mirror having a current input coupled to the second end of the current path of the first transistor and having a mirrored current output coupled to the second end of the current path of the second transistor.

3. The precision oscillator of claim 2 wherein the first transistor comprises a MOSFET transistor.

4. The precision oscillator of claim 3 wherein the first transistor comprises a p-channel transistor.

5. The precision oscillator of claim 1 wherein the reference current generator comprises:

a voltage divider circuit having a divided voltage output;

an amplifier having a first input coupled to the output of the voltage divider circuit, having a second input, and having an output;

a transistor having a control element coupled to the output of the amplifier and having a current path with a first end and a second end;

a resistor having a first end coupled to the second input of the amplifier and having a second end coupled to a ground; and a current mirror having an input coupled to the first end of the transistor and having a mirrored output coupled which forms an output of the reference current generator.

6. The oscillator circuit of claim 5 wherein the current mirror comprises;

a first transistor having a control element, having a current path with a first end coupled to a voltage source and a second end coupled to the control element; and at least one mirror transistor, each mirror transistor having a gate selectively coupled to the gate and the second end of the first transistor, having a current path with a first end coupled to the voltage source and a second end which forms an output of the current mirror.

7. The oscillator circuit of claim 6 wherein the first transistor comprises a MOSFET transistor.

8. The oscillator circuit of claim 7 wherein the transistor comprises a P-channel transistor.

9. The oscillator circuit of claim 1 wherein the voltage threshold generator comprises;

a three resistor voltage divider circuit having a first output voltage and having a second output voltage;

a first transistor having a control element and a current path having a first end coupled to the first voltage of the three resistor voltage divider circuit and having a second end; and a second transistor having a control element coupled to the control element of the first transistor, having current path with a first end coupled to the second output voltage of the three resistor voltage divider circuit and with a second end coupled to the second end of the current path of the first transistor.

10. The oscillator of claim 9 wherein the first and second transistors are MOSFET transistors.

11. The oscillator circuit of 9 wherein the first transistor is an N-channel transistor and the second transistor is a P-channel transistor.

12. A precision oscillator circuit comprising:

a means for generating a reference current having an output for supplying a reference current;

a means for controlling charge having a first input coupled to the output of the means for generating the reference current, having a second input, and having an output;

a capacitor having a first plate coupled to the output of the charge control stage and having a second plate coupled to ground;

a comparator having a first input coupled to the first plate of the capacitor, having a second input, and having an output coupled to the second input of the charge control stage; and a means for generating a voltage threshold having an input coupled to the output of the comparator and having an output coupled to the second input of the comparator.

13. The precision oscillator of claim 12 wherein the means for controlling charge comprises:

an inverter having an input coupled to the output of the comparator and having an output;

a first transistor having a control element coupled to the input of the inverter, and having a current path with a first end and a second end;

a second transistor having a control element coupled to the output of the inverter and having a current path with a first end coupled to the first end of the first transistor and having a second end; and a current mirror having a current input coupled to the second end of the current path of the first transistor and having a mirrored current output coupled to the second end of the current path of the second transistor.

14. The precision oscillator of claim 13 wherein the first transistor comprises a MOSFET transistor.

15. The precision oscillator of claim 14 wherein the first transistor comprises a p-channel transistor.

16. The precision oscillator of claim 12 wherein the means for generating a reference current comprises:

a voltage divider circuit having a divided voltage output;

an amplifier having a first input coupled to the output of the voltage divider circuit, having a second input, and having an output;

a transistor having a control element coupled to the output of the amplifier and having a current path with a first end and a second end;

a resistor having a first end coupled to the second input of the amplifier and having a second end coupled to a ground; and a current mirror having an input coupled to the first end of the transistor and having a mirrored output coupled which forms an output of the means for the reference current.

17. The oscillator circuit of claim 16 wherein the current mirror comprises;

a first transistor having a control element, having a current path with a first end coupled to a voltage source and a second end coupled to the control element; and at least one mirror transistor, each mirror transistor having a gate selectively coupled to the gate and the second end of the first transistor, having a current path with a first end coupled to the voltage source and a second end which forms an output of the current mirror.

18. The oscillator circuit of claim 17 wherein the first transistor comprises a MOSFET transistor.

19. The oscillator circuit of claim 18 wherein the MOSFET transistor comprises a P-channel transistor.

20. The oscillator circuit of claim 12 wherein the means for generating a voltage threshold generator;

- a three resistor voltage divider circuit having a first output voltage and having a second output voltage;
- a first transistor having a control element and a current path having a first end coupled to the first voltage of the three resistor voltage divider circuit and having a second end; and
- a second transistor having a control element coupled to the control element of the first transistor, having current path with a first end coupled to the second output voltage of the three resistor voltage divider circuit and with a second end coupled to the second end of the current path of the first transistor.

21. The oscillator of claim 20 wherein the first and second transistors are MOSFET transistors.

22. The oscillator circuit of 20 wherein the first transistor is an N-channel transistor and the second transistor is a P-channel transistor.

23. A speedometer system having a wheel sensor, analog voltage converter, an air core gauge motor, and a precision oscillator circuit, wherein the precision oscillator comprises:

- a reference current generator having an output for supplying a reference current;
- a charge control stage having a first input coupled to the output of the reference current generator, having a second input, and having an output;
- a capacitor having a first plate coupled to the output of the charge control stage and having a second plate coupled to ground;
- a comparator having a first input coupled to the first plate of the capacitor, having a second input, and having an output coupled to the second input of the charge control stage; and
- a voltage threshold generator having an input coupled to the output of the comparator and having an output coupled to the second input of the comparator.

* * * * *